United States Patent
Kwak et al.

(10) Patent No.: US 8,791,554 B2
(45) Date of Patent: Jul. 29, 2014

(54) SUBSTRATES FOR SEMICONDUCTOR DEVICES INCLUDING INTERNAL SHIELDING STRUCTURES AND SEMICONDUCTOR DEVICES INCLUDING THE SUBSTRATES

(75) Inventors: Dong-Ok Kwak, Suwon-si (KR); Sang-Sub Song, Suwon-si (KR); Sang-Ho An, Suwon-si (KR); Joon-Young Oh, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 252 days.

(21) Appl. No.: 13/530,881

(22) Filed: Jun. 22, 2012

(65) Prior Publication Data

US 2013/0020685 A1 Jan. 24, 2013

(30) Foreign Application Priority Data

Jul. 18, 2011 (KR) ........................ 10-2011-0071113

(51) Int. Cl.
*H01L 23/552* (2006.01)
*H01L 23/498* (2006.01)
*H01L 25/065* (2006.01)

(52) U.S. Cl.
CPC ....... *H01L 23/552* (2013.01); *H01L 2225/0651* (2013.01); *H01L 25/0657* (2013.01); *H01L 2924/15311* (2013.01); *H01L 2224/32145* (2013.01); *H01L 2225/06517* (2013.01); *H01L 2224/73265* (2013.01); *H01L 2224/48227* (2013.01); *H01L 23/49827* (2013.01); *H01L 2225/06565* (2013.01); *H01L 2225/06568* (2013.01); *H01L 2225/06562* (2013.01); *H01L 2225/06541* (2013.01); *H01L 2224/16225* (2013.01); *H01L 2225/06513* (2013.01); *H01L 2924/1815* (2013.01); *H01L 2224/32225* (2013.01); *H01L 2224/16145* (2013.01)
USPC .................. 257/659; 257/E23.114; 257/692; 257/700; 438/125

(58) Field of Classification Search
CPC ..................... H01L 23/552; H01L 2924/3025; H01L 2924/01079
USPC .......... 257/E23.114, E23.153, 503, 659, 660, 257/668, 676, 692, 693, 700, 734, 737, 738, 257/787; 438/121, 122, 125; 361/704, 719
See application file for complete search history.

(56) References Cited

U.S. PATENT DOCUMENTS 5,866,942 A 2/1999 Suzuki et al.
5,955,789 A 9/1999 Vendramin (Continued)

FOREIGN PATENT DOCUMENTS

KR 1020040054286 A 6/2004
KR 1020080031576 A 4/2008

*Primary Examiner* — Chris Chu
(74) *Attorney, Agent, or Firm* — Myers Bigel Sibley & Sajovec, PA

(57) ABSTRACT

A semiconductor device includes a substrate comprising a stack of alternating wiring layers and insulating layers. The wiring layers include conductive wiring patterns. Primary conductive vias extend through respective ones of the insulating layers and electrically connect first ones of the wiring patterns on different ones of the wiring layers to provide electrical connections between opposing first and second surfaces of the substrate. Dummy conductive vias extend through respective ones of the insulating layers and electrically connect second ones of the wiring patterns on different ones of the wiring layers. The dummy conductive vias are arranged in the substrate around a perimeter of a region including the first ones of the wiring patterns, and the dummy conductive vias and the second ones of the wiring patterns electrically connected thereto have a same electric potential to define an electromagnetic shielding structure within the substrate.

20 Claims, 12 Drawing Sheets

(56) References Cited

U.S. PATENT DOCUMENTS

| | | |
|---|---|---|
| 6,198,165 B1 * | 3/2001 | Yamaji et al. ............... 257/734 |
| 6,242,815 B1 * | 6/2001 | Hsu et al. .................... 257/786 |
| 6,265,783 B1 * | 7/2001 | Juso et al. ................... 257/786 |
| 6,282,094 B1 * | 8/2001 | Lo et al. ...................... 361/704 |
| 6,525,942 B2 * | 2/2003 | Huang et al. ................ 361/704 |
| 7,808,013 B2 * | 10/2010 | Mendendorp et al. ......... 257/99 |
| 7,838,417 B2 * | 11/2010 | Lopez .......................... 438/640 |
| 8,022,532 B2 * | 9/2011 | Kasuya et al. ............... 257/707 |
| 8,476,116 B2 * | 7/2013 | Chang et al. ................ 438/122 |
| 2008/0290495 A1 * | 11/2008 | Uematsu et al. ............ 257/691 |

* cited by examiner

1500

SUBSTRATES FOR SEMICONDUCTOR DEVICES INCLUDING INTERNAL SHIELDING STRUCTURES AND SEMICONDUCTOR DEVICES INCLUDING THE SUBSTRATES

This application claims priority from Korean Patent Application No. 10-2011-0071113 filed on Jul. 18, 2011 in the Korean Intellectual Property Office, the disclosure of which is incorporated herein by reference in its entirety.

BACKGROUND

The present inventive concept relates to a substrate for a semiconductor device and a semiconductor device including the substrate.

Electromagnetic interference (EMI) may present problems due to the smaller size and higher data speeds of electronic devices. Therefore, research is being conducted to shield EMI emitted from electronic devices.

After a semiconductor device (e.g., a semiconductor package) is mounted on a circuit board, an EMI shielding can that surrounds the semiconductor device may be installed on the circuit board. However, the height and width of the shielding can make it difficult to reduce the size of an electronic device in which the semiconductor device is installed.

In addition, if a plurality of semiconductor devices share one EMI shielding can, EMI may occur between package modules that share the same shielding can.

SUMMARY

Embodiments of the present inventive concept provide a substrate for a semiconductor device, the substrate capable of reducing the size of an electronic device.

Embodiments of the present inventive concept also provide a semiconductor device which can reduce the size of an electronic device.

The aspects of the present inventive concept described herein will become more apparent to one of ordinary skill in the art to which the present inventive concept pertains by referencing the detailed description of the present inventive concept given below. However, aspects of the present inventive concept are not restricted to those set forth herein.

According to some embodiments, a semiconductor device includes a substrate comprising a stack of alternating wiring layers and insulating layers. The wiring layers include conductive wiring patterns. Primary conductive vias extend through respective ones of the insulating layers and electrically connect first ones of the wiring patterns on different ones of the wiring layers to provide electrical connections between opposing first and second surfaces of the substrate. Dummy conductive vias extend through respective ones of the insulating layers and electrically connect second ones of the wiring patterns on different ones of the wiring layers. The dummy conductive vias are arranged in the substrate around a perimeter of a region including the first ones of the wiring patterns, and the dummy conductive vias and the second ones of the wiring patterns electrically connected thereto have a same electric potential to define an electromagnetic shielding structure within the substrate.

In some embodiments, the dummy conductive vias that extend through different ones of the insulating layers may not be aligned.

In some embodiments, the dummy conductive vias may be arranged physically closer to the region including the first ones of the wiring patterns than to edges of the wiring layers.

In some embodiments, in at least one of the wiring layers, the second ones of the wiring patterns may define a substantially planar dummy pattern including apertures therein between the dummy pattern and the first ones of the wiring patterns. For example, the at least one of the wiring layers may be adjacent the second surface of the substrate.

In some embodiments, a plurality of external contact terminals may protrude from the second surface of the substrate, and the external contact terminals may be electrically coupled to the first ones of the wiring patterns, respectively.

In some embodiments, the dummy pattern may have a ground voltage applied thereto.

In some embodiments, the external contact terminals may be signal terminals configured to receive driving signals from an external source. A plurality of dummy terminals may protrude from the second surface of the substrate. The dummy terminals may be electrically coupled to the dummy patterns and may be configured to have the ground voltage applied thereto.

In some embodiments, the dummy terminals may not be aligned with the dummy conductive vias.

In some embodiments, the signal terminals may protrude from the second surface of the substrate beyond the dummy terminals such that the dummy terminals do not contact a layer or structure, such as a motherboard, on which the substrate is mounted.

In some embodiments, at least one semiconductor chip may be provided on the first surface of the substrate. The first wiring patterns and the primary conductive vias may provide electrical connections between the at least one semiconductor chip and the plurality of external contact terminals.

According to further embodiments of the present inventive concept, there is provided a substrate for a semiconductor device, the substrate comprising a first wiring layer comprising a dummy pattern and first wiring patterns, a second wiring layer stacked on a surface of the first wiring layer and comprising second wiring patterns, a third wiring layer stacked on a surface of the second wiring layer and comprising third wiring patterns, and a plurality of through vias electrically connecting some of the third wiring patterns to the dummy pattern, wherein the first wiring layer comprises a first region in which the first wiring patterns are placed, and the through vias are arranged around the first region and placed closer to the first region than to edges of the first wiring layer.

According to still further embodiments of the present inventive concept, there is provided a substrate for a semiconductor device, the substrate comprising a first wiring layer comprising a dummy pattern and first wiring patterns, a second wiring layer stacked on a surface of the first wiring layer and comprising second wiring patterns, a third wiring layer stacked on a surface of the second wiring layer and comprising third wiring patterns, a first insulating layer interposed between the first wiring layer and the second wiring layer, a second insulating layer interposed between the second wiring layer and the third wiring layer, and a plurality of through vias electrically connecting some of the third wiring patterns to the dummy pattern, wherein the through vias comprise first through vias which penetrate the first insulating layer and second through vias which penetrate the second insulating layer, and the first through vias and the second through vias are not vertically aligned with each other.

Other substrates and/or devices according to some embodiments will become apparent to one with skill in the art upon review of the following drawings and detailed description. It is intended that all such additional devices, in addition to any combination of the above embodiments, be included within this description, be within the scope of the inventive concept, and be protected by the accompanying claims.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF EMBODIMENTS

Figure 1:
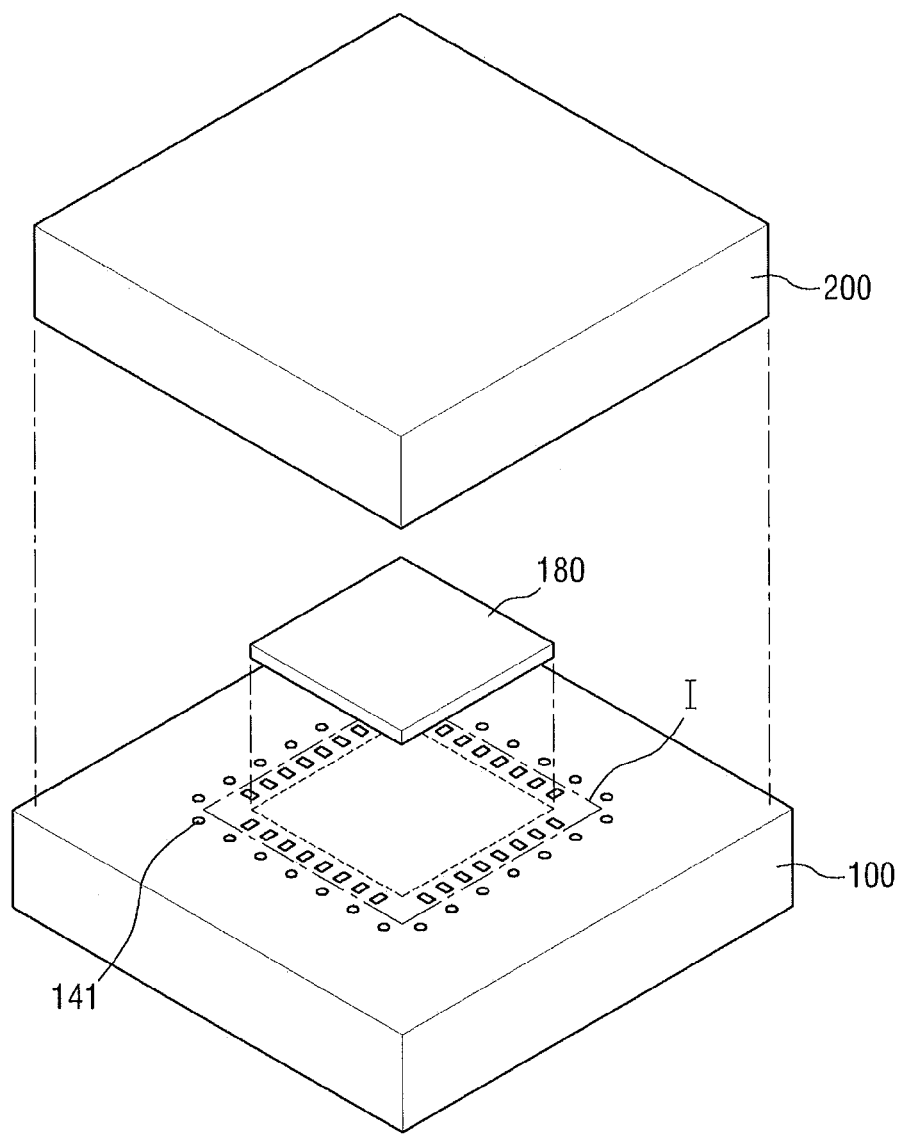
FIG. 1 is a perspective view of a substrate for a semiconductor device according to some embodiments of the present inventive concept.

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, sizes and relative sizes of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Spatially relative terms, such as "beneath", "below", "lower", "under", "above", "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
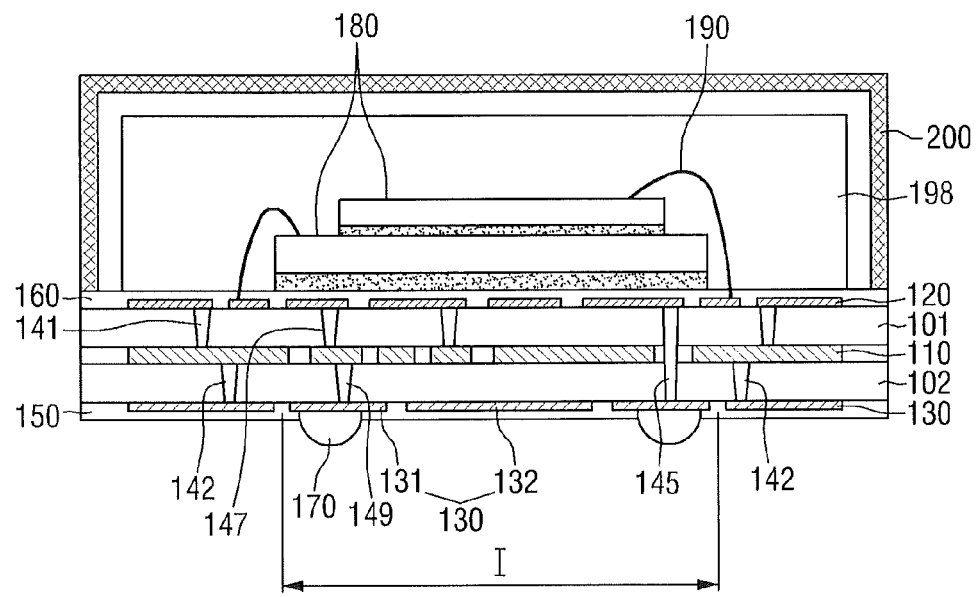
FIG. 2 is a cross-sectional view of a substrate for a semiconductor device according to some embodiments of the present inventive concept.
Figure 3:
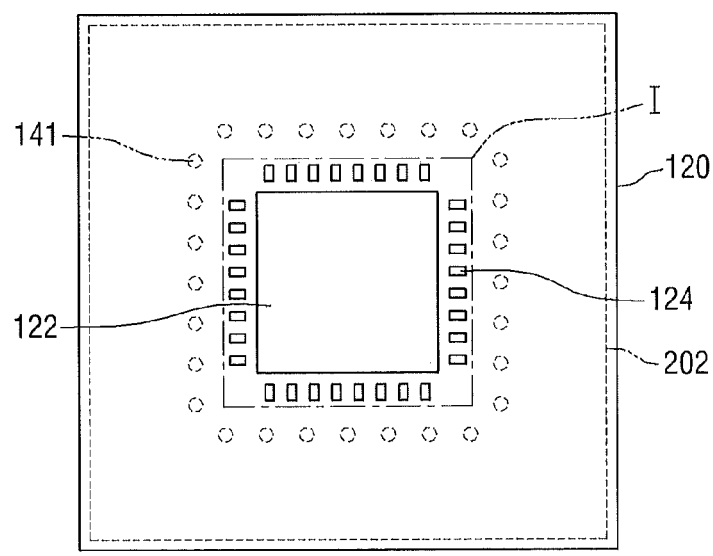
FIG. 3 is a top plan view illustrating the arrangement of a plurality of first through vias in the substrate shown in FIG. 1.
Figure 4:
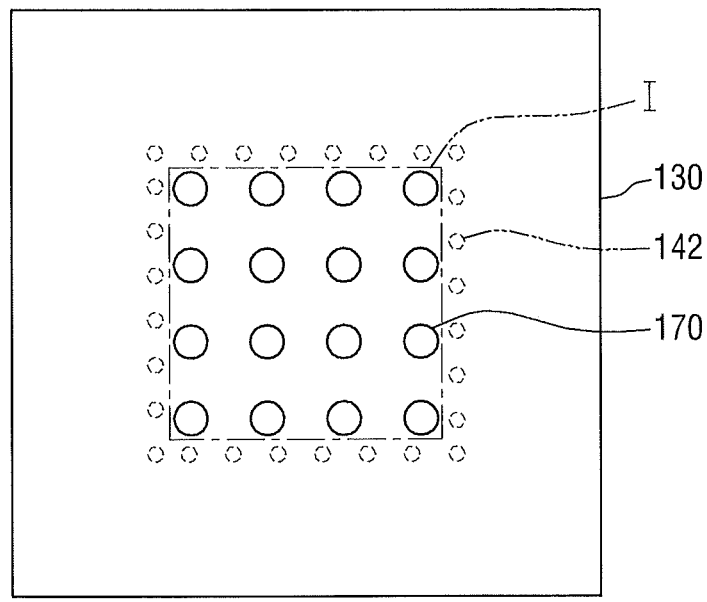
FIG. 4 is a bottom plan view illustrating the arrangement of a plurality of second through vias in the substrate shown in FIG. 1.
Figure 5:
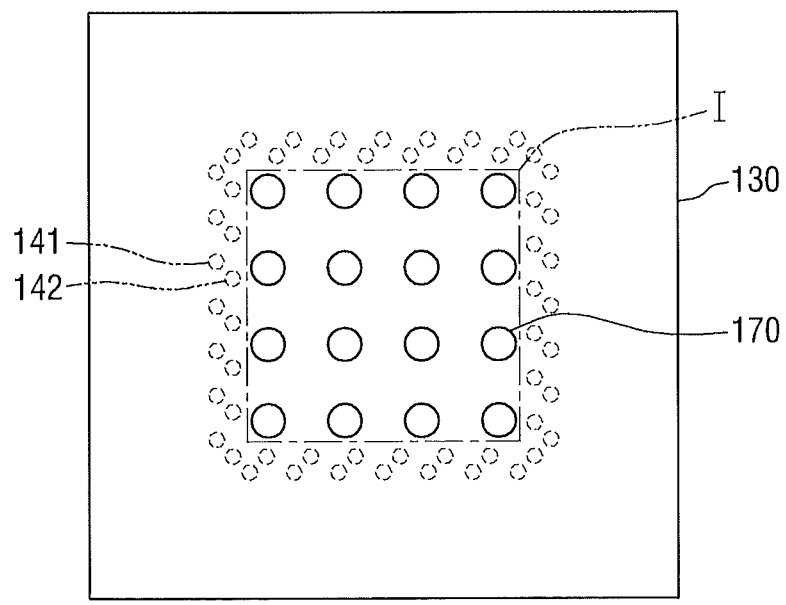
FIG. 5 is a bottom plan view illustrating the arrangement of a plurality of first and second through vias in the substrate of FIG. 2.
Figure 6:
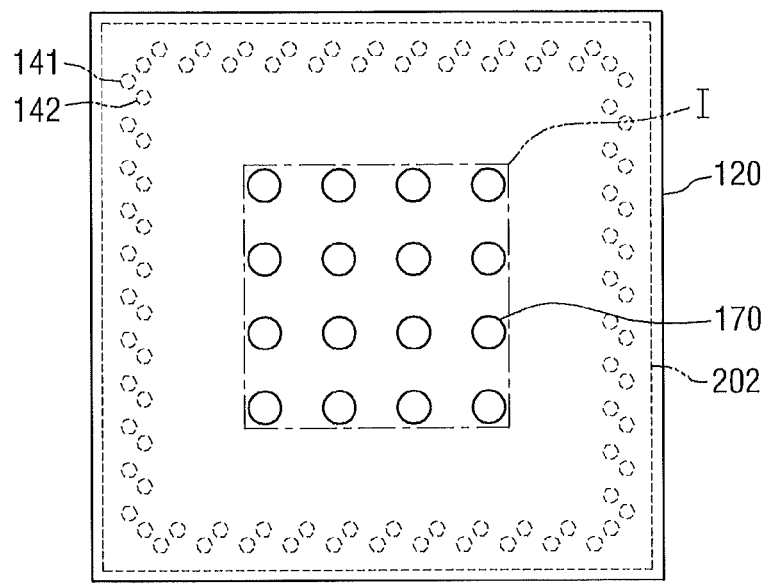
FIG. 6 is a bottom plan view illustrating the arrangement of a plurality of first and second through vias in a substrate for a semiconductor device according to further embodiments of the present inventive concept.
Figure 7:
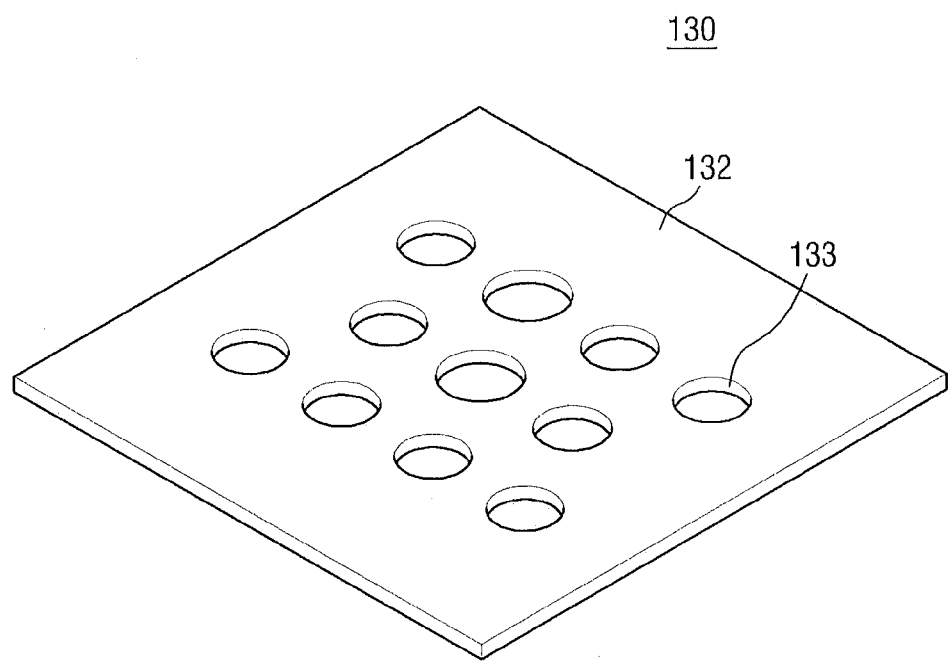
FIG. 7 is a perspective view of a first wiring layer shown in FIG. 2.
Figure 8:
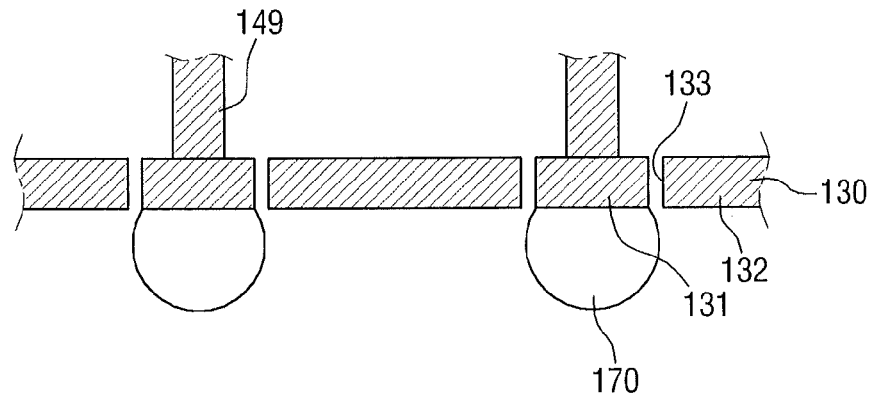
FIG. 8 is a cross-sectional view illustrating the positional relationship among a dummy pattern of the first wiring layer, first wiring patterns of the first wiring layer, a plurality of signal terminals, and through vias shown in FIG. 2.
Figure 9:
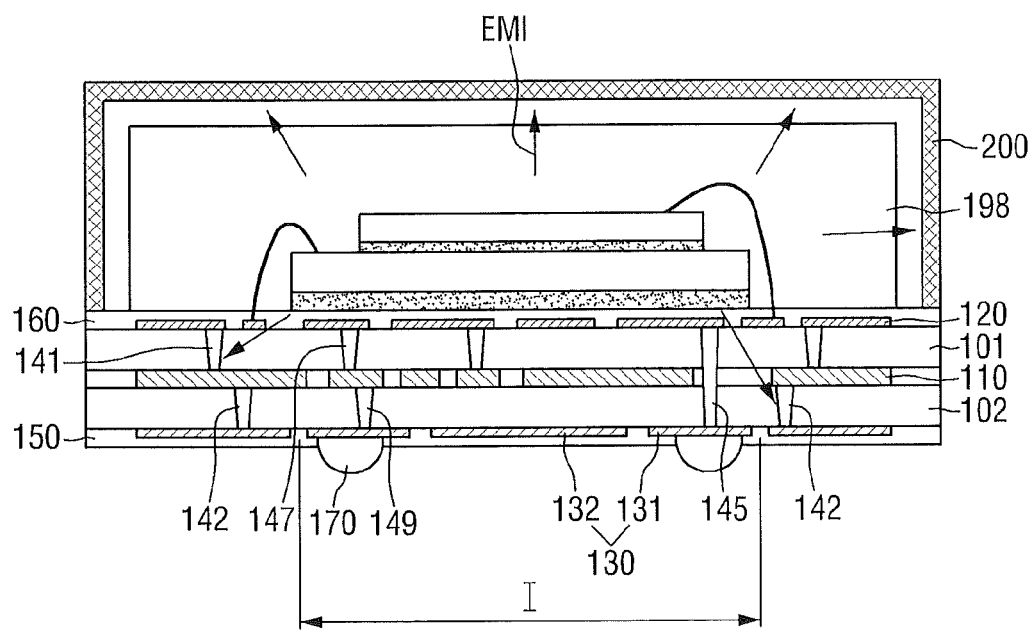
FIG. 9 is a cross-sectional view illustrating an electromagnetic interference (EMI) shielding operation of the substrate shown in FIG. 2.

Hereinafter, substrates for semiconductor devices according to embodiments of the present inventive concept will be described with reference to FIGS. 1 through 9. FIG. 1 is a perspective view of a substrate 100 for a semiconductor device according to embodiments of the present inventive concept. FIG. 2 is a cross-sectional view of a substrate 100 for a semiconductor device according to some embodiments of the present inventive concept. FIG. 3 is a top plan view illustrating the arrangement of a plurality of second through vias 141 in the substrate 100 shown in FIG. 1. FIG. 4 is a bottom plan view illustrating the arrangement of a plurality of first through vias 142 in the substrate 100 shown in FIG. 1. FIG. 5 is a bottom plan view illustrating the arrangement of a plurality of first and second through vias 142 and 141 in the substrate of FIG. 2. FIG. 6 is a bottom plan view illustrating the arrangement of a plurality of first and second through vias 142 and 141 in a substrate for a semiconductor device according to further embodiments of the present inventive concept. FIG. 7 is a perspective view of a first wiring layer 130 shown in FIG. 2. FIG. 8 is a cross-sectional view illustrating the positional relationship among a dummy pattern 132 of the first wiring layer 130, first wiring patterns 131 of the first wiring layer 130, a plurality of signal terminals, and through vias 147 and 149 shown in FIG. 2. FIG. 9 is a cross-sectional view illustrating an electromagnetic interference (EMI) shielding operation of the substrate 100 shown in FIG. 2.

Referring to FIGS. 1 through 9, the substrate 100 according to the embodiments of the present inventive concept includes a first wiring layer 130, a second wiring layer 110, a third wiring layer 120, and a plurality of conductive through vias 141 and 142.

Referring to FIGS. 1 and 2, one or more semiconductor chips 180 may be formed on a first or top surface of the substrate 100. The semiconductor chips 180 may be made of (for example but not limited to) silicon, silicon on insulator (SOI), or silicon germanium. Although not shown in detail, a plurality of wiring layers, a plurality of transistors and/or a plurality of passive elements may be integrated in each of the semiconductor chips 180. In FIG. 2, two semiconductor chips 180 are stacked and connected to the substrate 100 by bonding wires 190. However, the present inventive concept is not limited thereto, and other connections to the substrate 100 are included in embodiments of the present inventive concept.

A molding member 198 may be formed on the surface of the substrate 100 to mold the semiconductor chips 180. The molding member 198 may be formed of (for example but not limited to) an epoxy molding compound (EMC) or an underfill material. A shielding layer 200 may surround the molding member 198 and may be fixed onto the substrate 100.

Referring to FIGS. 2 through 4, the substrate 100 according to the embodiments of the present inventive concept includes the first wiring layer 130, the second wiring layer 110, the third wiring layer 120, and the through vias 141 and 142.

The first wiring layer 130 includes the first wiring patterns 131 and the dummy pattern 132. A first voltage may be applied to the first wiring patterns 131, and a second voltage may be applied to the dummy pattern 132. The first voltage and the second voltage may be different voltages. For example, the second voltage applied to the dummy pattern 132 may be a ground voltage, and the first voltage applied to the first wiring patterns 131 may be a voltage different from the second voltage, for example, a voltage for a driving signal.

The second wiring layer 110 includes second wiring patterns and is stacked on a surface of the first wiring layer 130. Likewise, the third wiring layer 120 includes third wiring patterns and is stacked on a surface of the second wiring layer 110. That is, the first wiring layer 130, the second wiring layer 110 and the third wiring layer 120 are stacked sequentially and are separated from each other. As shown in the drawings, a first insulating layer 102 may be interposed between the first wiring layer 130 and the second wiring layer 110, and a second insulating layer 101 may be interposed between the second wiring layer 110 and the third wiring layer 120. In other words, the substrate 100 includes a stack of alternating wiring layers 130, 110, 120 and insulating layers 102, 101.

The through vias 141 and 142 electrically connect some of the third wiring patterns of the third wiring layer 120 to the dummy pattern 132. More specifically, the through vias 141 and 142 may include first through vias 142 which penetrate the first insulating layer 102 and second through vias 141 which penetrate the second insulating layer 101. Accordingly, the through vias 141 and 142 extend through respective ones of the insulating layers 101 and 102 and electrically connect wiring patterns on different ones of the wiring layers 120, 110, and 130. The first through vias 142 and the second through vias 141 may not be vertically aligned with each other.

Further, as shown in the drawings, solder mask layers 150 and 160 may be formed on the other surface of the first wiring layer 130 and a surface of the third wiring layer 120, respectively, in order to protect the surfaces of the first wiring layer 130 and the third wiring layer 120.

Referring to FIGS. 3 and 4, the first wiring layer 130 includes a first region I in which the first wiring patterns 131 are provided, and the through vias 141 and 142 are arranged along a perimeter of or otherwise around the first region I. As shown in the drawings, the through vias 141 and 142 are placed closer to the first region I than to outer edges of the first wiring layer 130.

In some embodiments, the through vias 141 and 142, that is, the first through vias 142 that penetrate the first insulating layer 102 and the second through vias 141 that penetrate the second insulating layer 101, may be vertically aligned with each other. In other words, the first through vias 142 and the second through vias 141 may form through vias that penetrate both the first insulating layer 102 and the second insulating layer 101. In this case, the through vias are also placed closer to the first region I than to the edges of the first wiring layer 130.

Referring to the top plan view of FIG. 3, a chip region 122 (e.g., a die pad) in which the semiconductor chips 180 can be mounted may be defined in a top surface of the substrate 100. In addition, circuit patterns functioning as bond fingers may be formed and electrically connected to the semiconductor chips 180. As shown in the drawing, the second through vias 141 are arranged around the first region I and placed closer to the first region I than to the edges of the first wiring layer 130. Here, reference numeral 202 indicates a region in which the shielding layer 200 is placed.

Referring to the bottom plan view of FIG. 4, external contact terminals 170 may be placed on a bottom surface of the substrate 100. The first through vias 142 are arranged around the first region I and placed closer to the first region I than to the edges of the first wiring layer 130. As described above, the first region I may be a region in which the first wiring patterns 131 are placed. From the point of view of the bottom surface of the substrate 100, a region in which the external contact terminals 170 are placed may be defined as the first region I. The external contact terminals 170 illustrated in the drawing are solder balls; however, the present inventive concept is not limited thereto. For example, in some embodiments, the external contact terminals 170 may be conductive bumps, conductive spacers, a pin grid array (PGA), or the like.

In some embodiments, referring to the bottom plan view of FIG. 5, the first through vias 142 and the second through vias 141 which are not vertically aligned with each other may be placed closer to the first region I than to the edges of the first wiring layer 130 and may be arranged around the first region I. When the first and second through vias 142 and 141 are arranged around the perimeter of the first region I, they may surround the first region I when seen in a plan view.

In some other embodiments, referring to FIG. 6, the first through vias 142 and the second through vias 141 may not be vertically aligned with each other and may be arranged along the edges of the first wiring layer 130. When the first and second through vias 142 and 141 are not vertically aligned with each other, an imaginary line extending in a direction in which the first through vias 142 extend may be different from an imaginary line extending in a direction in which the second through vias 141 extend. The first through vias 142 and the second through vias 141 may be electrically connected by the second wiring patterns of the second wiring layer 110.

Referring to FIG. 7, the first wiring layer 130 may extend along the surface of the substrate 100 and may include one or more holes or openings extending therethrough. Further, the first wiring patterns 131 for delivering driving signals (such as a command signal and a data signal) to the semiconductor chips 180 may be island-shaped and may be formed in the holes, respectively. In other words, the first wiring layer 130 may include the dummy pattern 132 and the first wiring patterns 131, wherein the dummy pattern 132 may be substantially planar (for example, shaped like a single, physically undivided plate), and a plurality of apertures or holes 133 may be formed in the single plate 132.

Referring to FIG. 8, the first wiring patterns 131 may be formed in the apertures 133, and a plurality of signal terminals for receiving driving signals may be disposed on the first wiring patterns 131, respectively. Ones of the first wiring patterns 131 may electrically contact wiring patterns of the second wiring layer 110 and/or the third wiring layer 120 by through vias 149, 147, and/or 145. As shown in FIG. 2, a driving signal transmitted to each of the first wiring patterns 131 may be delivered to the semiconductor chips 180 via one of the external contact terminals 170, the first wiring patterns 131, the through via 149, the second wiring layer 110, a through via 147, and the third wiring layer 120. The through vias 149, 147, 145 used to transmit signals between the external contact terminals 170 to the chips 180 may also be referred to herein as primary conductive vias.

Referring to FIG. 9, the first through vias 142 and the second through vias 141 may be arranged around the first region I in which the first wiring patterns 131 are disposed and may be placed closer to the first region I than to the outer edges of the first wiring layer 130. In some embodiments, the first through vias 142 may be placed diagonally relative to the second through vias 141 as shown by way of example in FIGS. 5 and 6. That is, the first through vias 142 may not be vertically aligned with the second through vias 141. In some other embodiments, the first through vias 142 and the second through vias 141 may be vertically aligned with each other.

Since the first through vias 142 and the second through vias 141 are electrically connected to the dummy pattern 132 of the first wiring layer 130 as shown in FIG. 9, if a first voltage, e.g., a ground voltage, is applied to the dummy pattern 132, the first through vias 142 and the second through vias 141 may have the same electric potential. That is, the ground voltage may be applied to all of the first through vias 142, the second through vias 141, and the dummy pattern 132. Accordingly, EMI generated by the semiconductor chips 180 may be shielded by the dummy pattern 132, the first through vias 142, the second through vias 141, and the shielding layer 200.

As shown in the drawing, EMI emitted upward relative to the chips 180 may be shielded by the shielding layer 200, and EMI emitted downward relative to the chips 180 may be shielded by the dummy pattern 132. In addition, EMI emitted laterally may be shielded by the first through vias 142 and the second through vias 141, which may also be referred to herein as ground ring vias or dummy conductive vias. That is, the first through vias 142, the second through vias 141 and the dummy pattern 132 may define an EMI shielding structure within the substrate 100 and/or otherwise serve as EMI shielding layers which shield EMI emitted laterally and downward. That is, the first through vias 142 and the second through vias 141 may be electrically connected to each other to reinforce a ground layer, thereby suppressing the occurrence of EMI.

Accordingly, semiconductor devices according to embodiments of the present inventive concept can shield EMI emitted upward, downward and/or laterally at a package level. Therefore, if semiconductor devices according to such embodiments are used in an electronic device, the size of the electronic device can be reduced.

The substrate 100 used in the embodiments of the present inventive concept is a three-layer substrate including the first wiring layer 130, the second wiring layer 110, and the third wiring layer 120. However, the present inventive concept is not limited thereto, and the substrate 100 can include four or more layers in some embodiments.

Figure 10:
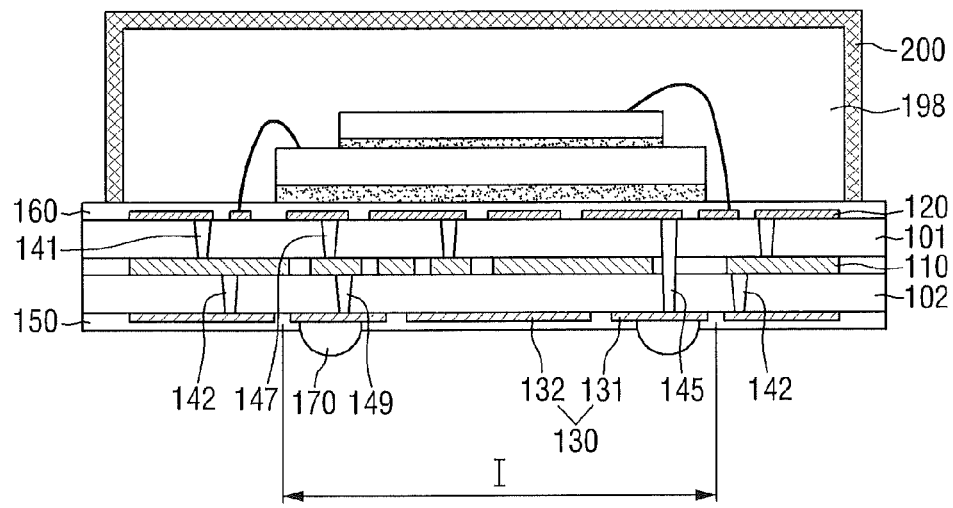
FIG. 10 is a cross-sectional view of a substrate for a semiconductor device according to some embodiments of the present inventive concept.

FIG. 10 is a cross-sectional view of a substrate for a semiconductor device according to further embodiments of the present inventive concept. The substrate according to the current embodiments may differ from the substrate according to the previous embodiments in that a shielding layer 200 is formed directly on a molding member 198. For simplicity, the following description will focus on differences from the previous embodiments, and a description of elements substantially identical to those of the previous embodiment will be omitted or simplified.

Referring to FIG. 10, the shielding layer 200 is formed directly on the molding member 198. For example, the shielding layer 200 may be coated on the molding member 198. In the embodiment of FIG. 10, a dipping process may be used; however, this is merely an example, and the shielding layer 200 can be formed directly on the molding member 198 using various other processes.

Figure 11:
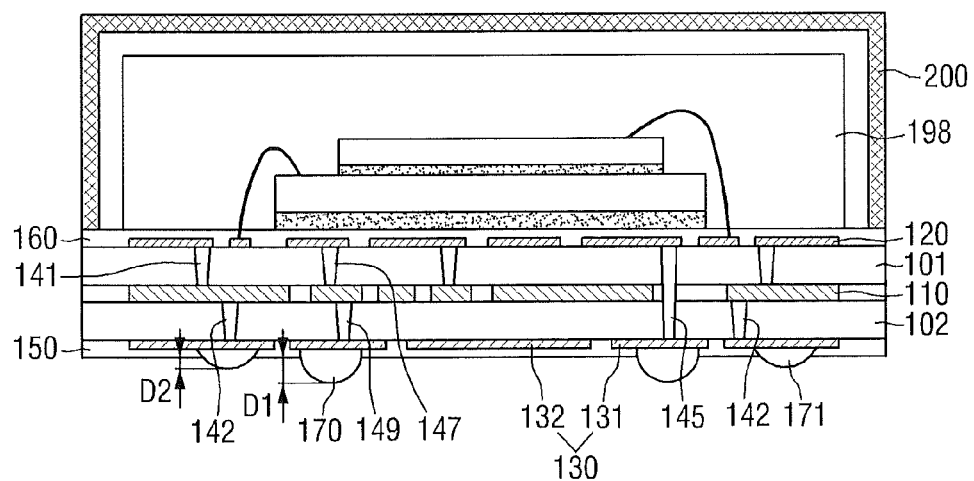
FIG. 11 is a cross-sectional view of a substrate for a semiconductor device according to some embodiments of the present inventive concept.

FIG. 11 is a cross-sectional view of a substrate for a semiconductor device according to other embodiments of the present inventive concept. The substrate according to the current embodiments may differ from the substrates according to the previous embodiments in that it further includes a plurality of dummy terminals 171. For simplicity, the following description will focus on differences from the previous embodiments, and a description of elements substantially identical to those of the previous embodiments will be omitted or simplified.

Referring to FIG. 11, external contact terminals are disposed on a first wiring layer 130. Here, the external contact terminals may include a plurality of signal terminals 170 and a plurality of dummy terminals 171 protruding from the wiring layer 130. As shown in the drawing, the signal terminals 170 may be terminals that receive driving signals transmitted to one or more semiconductor chips 180 using through vias 145, 147 and 149. On the other hand, the dummy terminals 171 may be terminals that do not receive the driving signals.

The dummy terminals 171 may be connected to a dummy pattern 132 which contacts second through vias 141. Accordingly, the dummy terminals 171 may be electrically connected to the second through vias 141. Although not shown in the drawing, the dummy terminals 171 may not be aligned with the first and second through vias 142 and 141. That is, the dummy terminals 171 may be placed at different positions from those of the first and second through vias 142 and 141. Thus, the area maintained at the same electric potential may be increased, thereby improving the EMI shielding effect.

Figure 17:
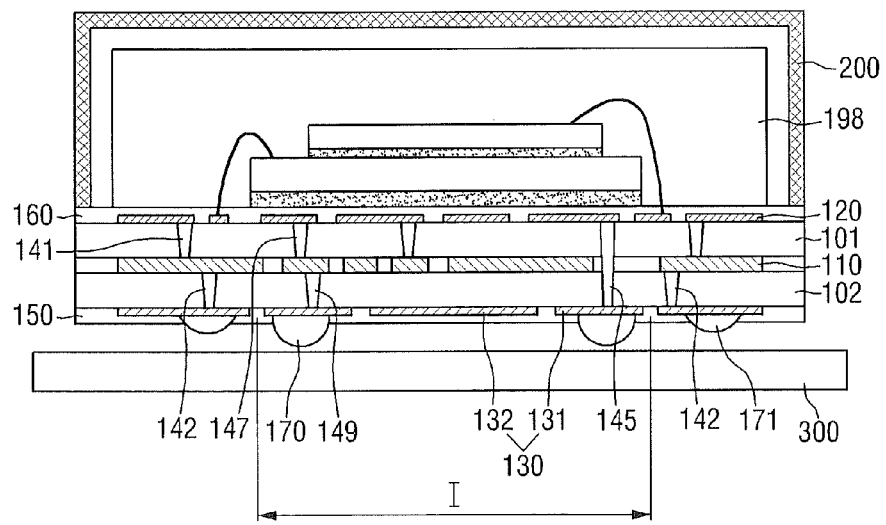
FIG. 17 is a cross-sectional view of a semiconductor device according to some embodiments of the present inventive concept.

As shown in the drawing, the dummy terminals 171 may have a different thickness from that of the signal terminals 170. More specifically, the signal terminals 170 may have a first thickness D1 measured from the surface of the first wiring layer 130, and the dummy terminals 171 may have a second thickness D2 measured from the same surface of the first wiring layer 130. The thickness D2 of the dummy terminals 171 may be smaller or less than the thickness D1 of the signal terminals 170, such that the signal terminals 170 protrude from the surface of the substrate 100 beyond the dummy terminals 171. Therefore, when the substrate is mounted on a motherboard 300 as shown in FIG. 17 which will be described later, the signal terminals 170 may contact the motherboard 300, but the dummy terminals 171 may not contact the motherboard 300.

Figure 12:
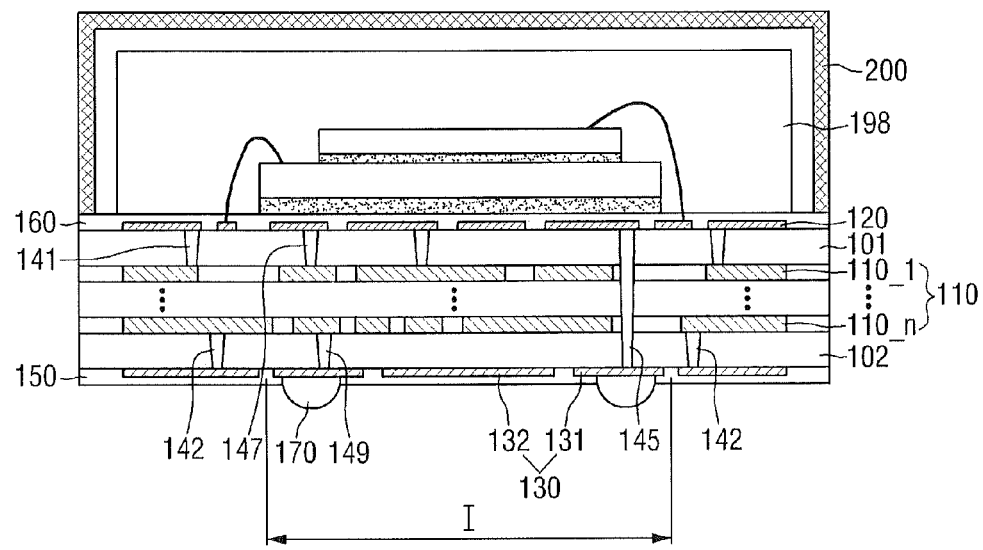
FIG. 12 is a cross-sectional view of a substrate for a semiconductor device according to some embodiments of the present inventive concept.

FIG. 12 is a cross-sectional view of a substrate for a semiconductor device according to further embodiments of the present inventive concept. For simplicity, the following description will focus on differences from the substrate according to the embodiment of FIG. 2.

Referring to FIG. 12, a second wiring layer 110 may include first through $n^{th}$ sub second wiring layers 110_1 through 110_n, where n is a natural number equal to or greater than two.

Figure 13:
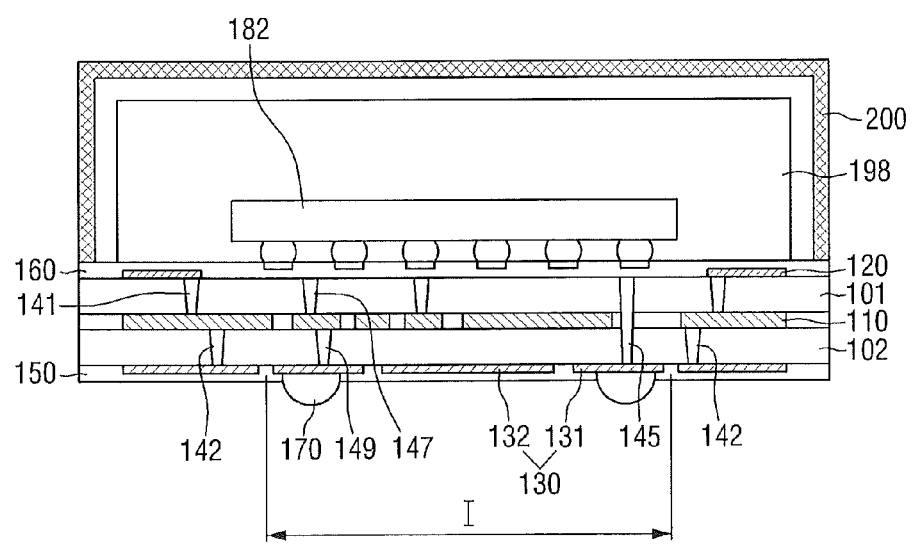
FIG. 13 is a cross-sectional view of a substrate for a semiconductor device according to some embodiments of the present inventive concept.
Figure 14:
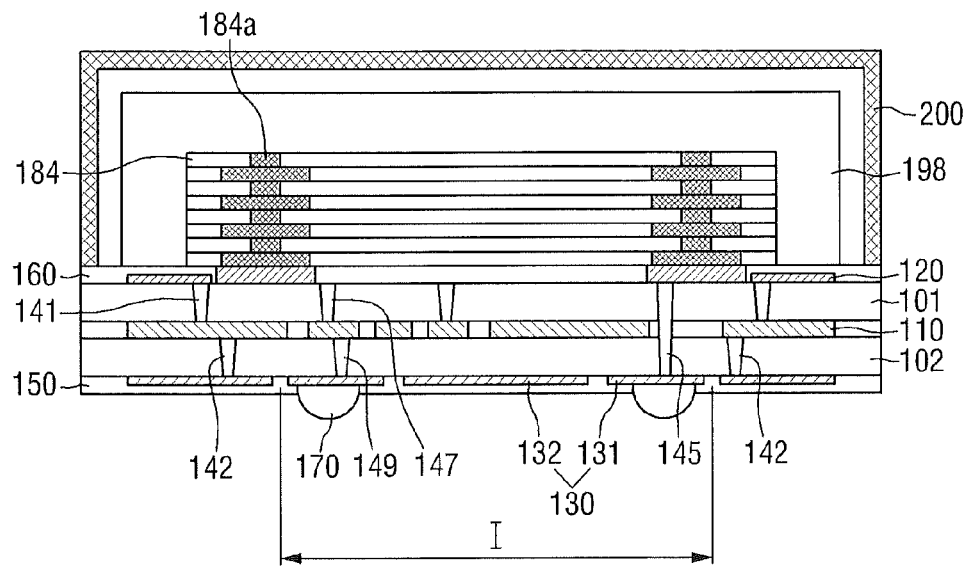
FIG. 14 is a cross-sectional view of a substrate for a semiconductor device according to some embodiments of the present inventive concept.

FIGS. 13 and 14 are cross-sectional views of substrates for semiconductor devices according to still further embodiments of the present inventive concept.

Referring to FIG. 13, a semiconductor chip 182 mounted on the substrate according to the current embodiments may be of a flip-chip type.

Referring to FIG. 14, the substrate according to the current embodiments may include a plurality of stacked semiconductor chips 184, and each of the semiconductor chips 184 may include through electrodes 184a. The through electrodes 184a may be through silicon vias. As shown in FIG. 14, the through electrodes 184a may penetrate or extend completely through each of the semiconductor chips 184 from a first surface thereof to a second surface. The through electrodes 184a may electrically connect the first and second surfaces of each of the semiconductor chips 184.

Figure 15:
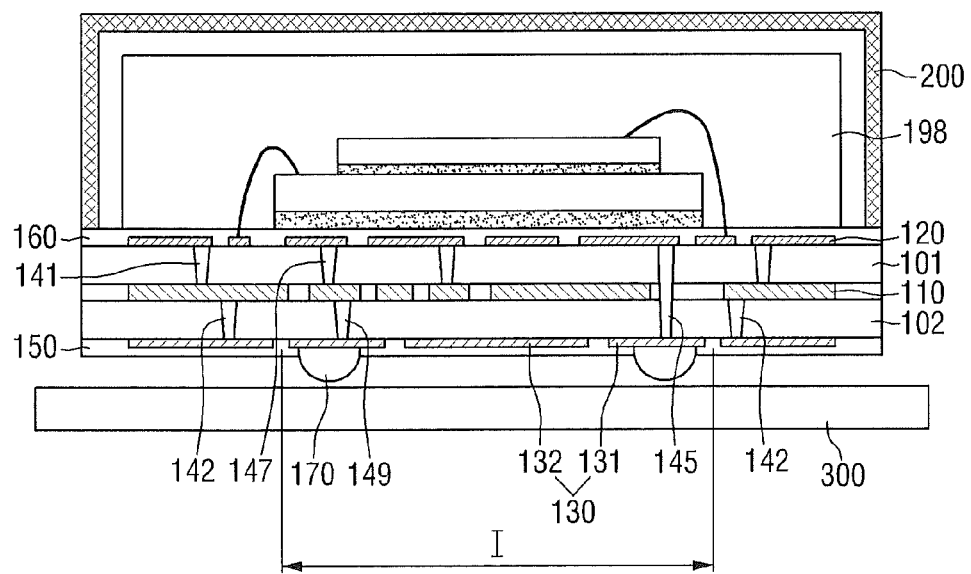
FIG. 15 is a cross-sectional view of a semiconductor device according to some embodiments of the present inventive concept.
Figure 16:
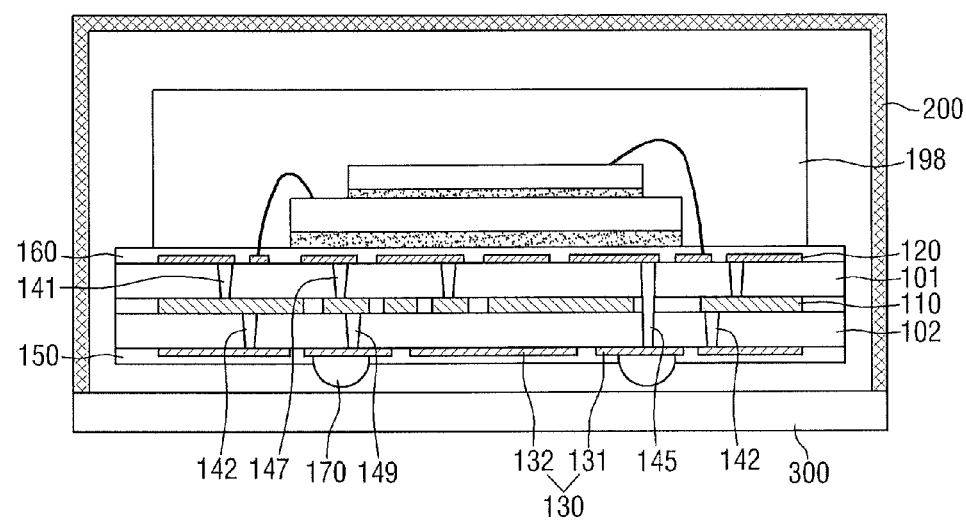
FIG. 16 is a cross-sectional view of a semiconductor device according to further embodiments of the present inventive concept.

Hereinafter, semiconductor devices according to embodiments of the present inventive concept will be described with reference to FIGS. 15 through 17. FIGS. 15 through 17 are cross-sectional views of semiconductor devices according to embodiments of the present inventive concept.

Referring to FIG. 15, the semiconductor device according to the current embodiments may include a substrate 100 for a semiconductor device, a molding member 198, a shielding layer 200, and a motherboard 300.

The molding member 198 molds one or more semiconductor chips 180 mounted on the substrate 100, and the substrate 100 is mounted on the motherboard 300. As shown in the drawing, the shielding layer 200 may surround the molding member 198 and may be formed on the substrate 100. That is, ends of the shielding layer 200 may be formed on a top surface of the substrate 100.

Accordingly, the semiconductor device according to the current embodiments can shield EMI emitted upward with the shielding layer 200, shield EMI emitted downward with a dummy pattern 132 of a first wiring layer 130, and shield EMI emitted laterally with first through vias 142 and second through vias 141. That is, the semiconductor device can shield EMI emitted laterally and downward at a package level using shielding structures within the substrate as described herein, and can shield EMI emitted upward with the shielding layer 200.

Referring to FIG. 16, the semiconductor device according to the current embodiments may differ from the semiconductor device according to the embodiment of FIG. 15 in that a shielding layer 200 surrounds a substrate 100 for a semiconductor device in addition to surrounding a molding member 198. That is, ends of the shielding layer 200 may be formed on a motherboard 300. In other words, since the shielding layer 200 surrounds both the substrate 100 and the molding member 198, EMI emitted laterally can be shielded not only by first through vias 142 and second through vias 141 that may define the shielding structures described herein, but also by the shielding layer 200.

Referring to FIG. 17, the semiconductor device according to the current embodiments may differ from the semiconductor device according to the embodiment of FIG. 15 in that it includes a plurality of dummy terminals 171 which do not contact a motherboard 300. More specifically, a plurality of external contact terminals formed on a bottom surface of a substrate 100 for a semiconductor device may include a plurality of signal terminals 170 and a plurality of dummy terminals 171. The signal terminals 170 contact the motherboard 300, and the dummy terminals 171 do not contact the motherboard 300.

As shown in the drawing, the signal terminals 170 may be thicker than or may otherwise protrude from the surface of the substrate 100 beyond the dummy terminals 171. Accordingly, when the signal terminals 170 contact the motherboard 300, the dummy terminals 171 may not contact the motherboard 300 but may be separated from the motherboard 300. Therefore, the dummy terminals 171 can be placed on a first wiring layer 130 regardless of wiring patterns formed on the motherboard 300. This may make the placement of the dummy terminals 171 easier.

Hereinafter, semiconductor systems according to some embodiments of the present inventive concept will be described with reference to FIGS. 18 through 21.

Figure 18:
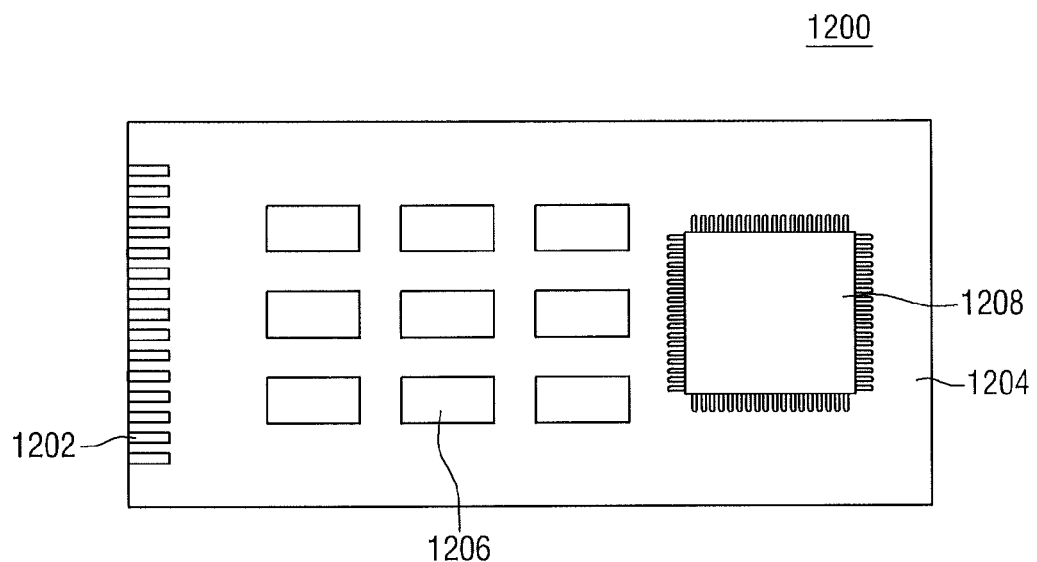
FIG. 18 is a plan view of a semiconductor system according to some embodiments of the present inventive concept.

FIG. 18 is a plan view of a system 1200 according to some embodiments of the present inventive concept.

Referring to FIG. 18, the system 1200 according to the current embodiments may be a package module. The system 1200 may include a module substrate 1204 which includes external connection terminals 1202 and semiconductor devices 1206 and 1208. While the semiconductor device 1208 shown in the drawing is a quad flat package (QFP) semiconductor package, the present inventive concept is not limited thereto. The semiconductor devices 1206 and 1208 may include at least one of the substrates described above with reference to FIGS. 1 through 17.

Figure 19:
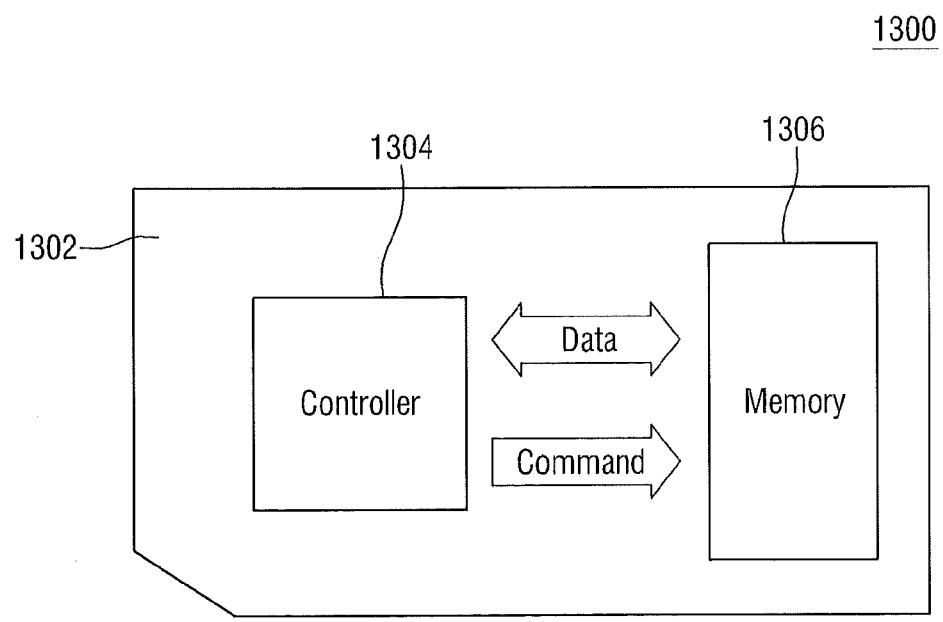
FIG. 19 is a block diagram of a semiconductor system according to some embodiments of the present inventive concept.

FIG. 19 is a block diagram of a system 1300 according to further embodiments of the present inventive concept.

Referring to FIG. 19, the system 1300 according to the current embodiments may be a memory card. The semiconductor system 1300 may include a controller 1304 and a memory 1306 within a housing 1302. The controller 1304 and the memory 1306 may exchange electrical signals with each other. For example, the memory 1306 and the controller 1304 may exchange data with each other in response to a command from the controller 1304. Accordingly, the system 1300 may store data in the memory 1306 or output data from the memory 1306 to an external destination. The controller 1304 and/or the memory 1306 may include at least one of the substrates described above with reference to FIGS. 1 through 17.

The system 1300 may be used as a data storage medium for various portable devices. Examples of the semiconductor system 1300 include a multimedia card (MMC) and a secure digital (SD) card.

Figure 20:
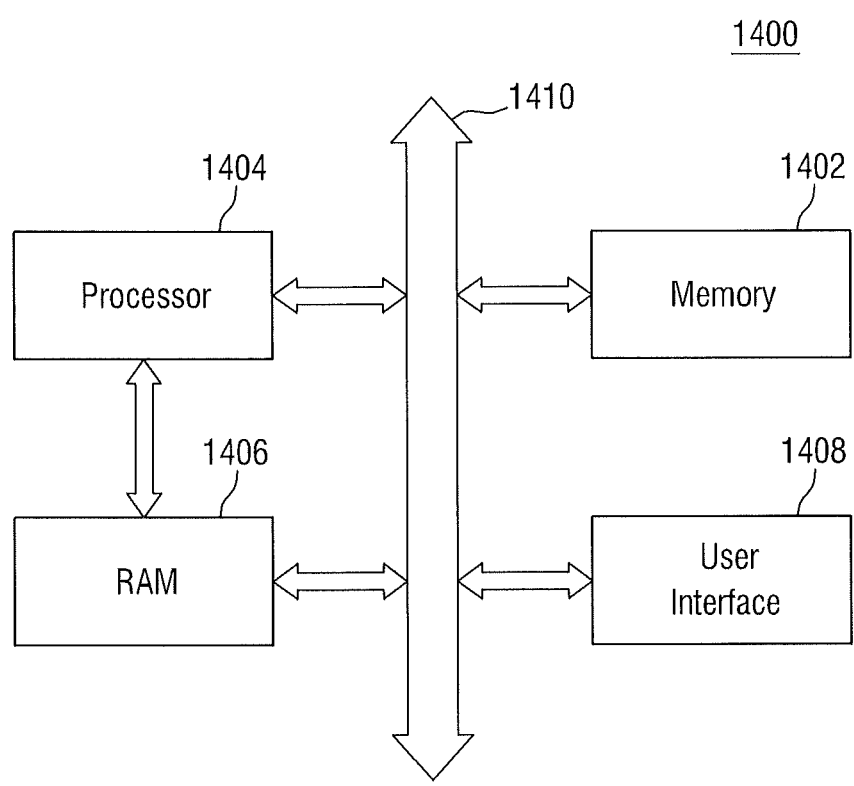
FIG. 20 is a block diagram of a semiconductor system according to some embodiments of the present inventive concept.
Figure 21:
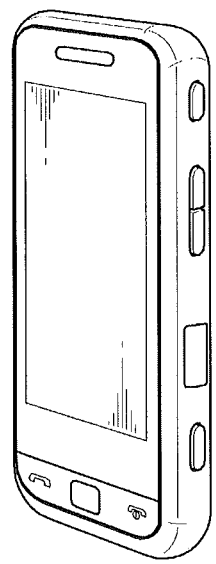
FIG. 21 illustrates an example electronic device to which the semiconductor system of FIG. 20 is applied.

FIG. 20 is a block diagram of a system 1400 according to still further embodiments of the present inventive concept. FIG. 21 illustrates an example electronic device to which the system 1400 of FIG. 20 is applied.

Referring to FIG. 20, the system 1400 according to the current embodiments may include a memory system 1402, a processor 1404, a random access memory (RAM) 1406, and a user interface 1408. These elements may exchange data with each other using a bus 1410. The processor 1404 may execute a program and control the system 1400. The RAM 1406 may be used as a working memory of the processor 1404. The processor 1404 and the RAM 1406 may be included in one semiconductor package. For example, a logic chip having the processor 1404 and a memory chip having the RAM 1406 may be included in a system-in package and may communicate wirelessly with each other. The user interface 1408 may be used to input or output data to/from the system 1400. The memory system 1402 may store codes used to operate the processor 1404, data processed by the processor 1404, or data input from an external source. The memory system 1402 may include a controller and a memory and may be configured in substantially the same or similar manner as the system 1300 of FIG. 19.

The system 1400 according to the embodiment of FIG. 20 can be applied to electronic controllers for various electronic devices. For example, the system 1400 can be applied to a mobile phone 1500, as shown in FIG. 21. The system 1400 can also be applied to portable game players, portable notebooks, MP3 players, navigation devices, solid-state disks (SSDs), vehicles, and/or household appliances, among others.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device, comprising:
    a substrate comprising a stack of alternating wiring layers and insulating layers, the wiring layers including conductive wiring patterns;
    primary conductive vias extending through respective ones of the insulating layers and electrically connecting first ones of the wiring patterns on different ones of the wiring layers to provide electrical connections between opposing first and second surfaces of the substrate; and
    dummy conductive vias extending through respective ones of the insulating layers and electrically connecting second ones of the wiring patterns on different ones of the wiring layers,
    wherein the dummy conductive vias are arranged in the substrate around a perimeter of a region including the first ones of the wiring patterns, and wherein the dummy conductive vias and the second ones of the wiring patterns electrically connected thereto have a same electric potential to define an electromagnetic shielding structure within the substrate.

2. The device of claim 1, wherein the dummy conductive vias extending through different ones of the insulating layers are not aligned relative to one another.

3. The device of claim 2, wherein the dummy conductive vias are arranged closer to the region including the first ones of the wiring patterns than to edges of the wiring layers.

4. The device of claim 3, wherein, in at least one of the wiring layers, the second ones of the wiring patterns define a substantially planar dummy pattern including apertures therein between the dummy pattern and the first ones of the wiring patterns.

5. The device of claim 4, wherein the at least one of the wiring layers is adjacent the second surface of the substrate, and further comprising:
    a plurality of external contact terminals protruding from the second surface of the substrate, wherein the external contact terminals are electrically coupled to the first ones of the wiring patterns, respectively.

6. A substrate for a semiconductor device, the substrate comprising:
    a first wiring layer comprising a dummy pattern and first wiring patterns;
    a second wiring layer stacked on the first wiring layer and comprising second wiring patterns;
    a third wiring layer stacked on the second wiring layer and comprising third wiring patterns; and
    a plurality of through vias electrically connecting some of the third wiring patterns to the dummy pattern,
    wherein the first wiring layer comprises a first region in which the first wiring patterns are placed, and the through vias are arranged around the first region and placed closer to the first region than to edges of the first wiring layer such that the through vias define an electromagnetic shielding structure.

7. The substrate of claim 6, wherein the dummy pattern is shaped like a single, physically undivided plate, and includes a plurality of apertures in the single plate.

8. The substrate of claim 7, wherein a plurality of signal terminals which receive driving signals are disposed on the first wiring patterns, and wherein a plurality of dummy terminals which do not receive the driving signals are disposed on the dummy pattern.

9. The substrate of claim 8, wherein a ground voltage is applied to the dummy terminals.

10. The substrate of claim 8, wherein the signal terminals have a first thickness from a bottom surface of the first wiring layer, and the dummy terminals have a second thickness from the bottom surface of the first wiring layer, wherein the second thickness is smaller than the first thickness.

11. The substrate of claim 8, wherein the signal terminals contact a motherboard on which the substrate is mounted, and wherein the dummy terminals do not contact the motherboard.

12. The substrate of claim 6, wherein a plurality of signal terminals which receive driving signals are disposed on the first wiring patterns, and a plurality of dummy terminals which do not receive the driving signals are disposed on the dummy pattern.

13. The substrate of claim 12, wherein the dummy terminals are placed in contact with the through vias.

14. The substrate of claim 6, further comprising solder mask layers formed on the other surface of the first wiring layer and a surface of the third wiring layer, respectively.

15. A substrate for a semiconductor device, the substrate comprising:
   a first wiring layer comprising a dummy pattern and first wiring patterns;
   a second wiring layer stacked on the first wiring layer and comprising second wiring patterns;
   a third wiring layer stacked on the second wiring layer and comprising third wiring patterns;
   a first insulating layer interposed between the first wiring layer and the second wiring layer;
   a second insulating layer interposed between the second wiring layer and the third wiring layer; and
   a plurality of through vias electrically connecting some of the third wiring patterns to the dummy pattern to define an electromagnetic shielding structure,
   wherein the through vias comprise first through vias which penetrate the first insulating layer and second through vias which penetrate the second insulating layer, and the first through vias and the second through vias are not vertically aligned with each other.

16. The substrate of claim 15, wherein the first through vias and the second through vias are electrically connected to each other by the second wiring patterns.

17. The substrate of claim 15, wherein the dummy pattern is shaped like a single, physically undivided plate, and includes a plurality of apertures in the single plate.

18. The substrate of claim 17, wherein a plurality of signal terminals which receive driving signals are disposed on the first wiring patterns, and wherein a plurality of dummy terminals which do not receive the driving signals are disposed on the dummy pattern.

19. The substrate of claim 17, wherein a ground voltage is applied to the dummy terminals.

20. The substrate of claim 15, wherein a plurality of signal terminals which receive driving signals are disposed on the first wiring patterns, wherein a plurality of dummy terminals which do not receive the driving signals and to which a ground voltage is applied are disposed on the dummy pattern, and wherein the dummy terminals are placed in contact with the plurality of through vias.

* * * * *